(12) United States Patent
Hirano

(10) Patent No.: US 6,442,075 B2
(45) Date of Patent: Aug. 27, 2002

(54) ERASING METHOD FOR NONVOLATILE SEMICONDUCTOR MEMORY DEVICE CAPABLE OF IMPROVING A THRESHOLD VOLTAGE DISTRIBUTION

(75) Inventor: Yasuaki Hirano, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/897,999

(22) Filed: Jul. 5, 2001

(30) Foreign Application Priority Data

Jul. 5, 2000 (JP) ........................................ 2000-203865

(51) Int. Cl.[7] .............................................. G11C 16/04
(52) U.S. Cl. .............................. 365/185.29; 365/185.19
(58) Field of Search ....................... 365/185.29, 185.28, 365/185.3, 185.33, 185.19

(56) References Cited

U.S. PATENT DOCUMENTS 5,357,476 A * 10/1994 Kuo ............................ 365/218
5,831,905 A 11/1998 Hirano .................. 365/185.29

FOREIGN PATENT DOCUMENTS

JP          9-320282         12/1997

OTHER PUBLICATIONS

Kuniyoshi Yoshikawa et al., Comparison of Current Flash EEPROM Erasing Method: Stability and How to Control. IEEE pp. 2421–2424 (1992.

Kenichi Oyama et al., Control of Erased Flash Memory's Threshold Voltage by 2–Step Erasing Scheme. The Institute of Electronics pp. 35–41 (May 1993).

* cited by examiner

Primary Examiner—Amir Zarabian
(74) Attorney, Agent, or Firm—Morrison & Foerster, LLP

(57) ABSTRACT

In a first step, "application of an erasing pulse" and "verification" are conducted so that all the memory cells in an erasing-target block are set to 3V or less. Consequently, generation of a memory cell with a negative threshold voltage is prevented, and accurate verification is conducted to ensure that all the memory cells in a block are brought in an erased state. In a second step, "application of an erasing pulse" is executed to set a threshold voltage of the most erase-slow memory cell to 1.5V or less. In this process, instead of conducting verification, the pulse is applied N times as large as the number of pulse application in the first step. In a third step, "application of a program pulse" and "verification" are conducted to execute a channel writing.

14 Claims, 13 Drawing Sheets

ERASING METHOD FOR NONVOLATILE SEMICONDUCTOR MEMORY DEVICE CAPABLE OF IMPROVING A THRESHOLD VOLTAGE DISTRIBUTION

BACKGROUND OF THE INVENTION

The present invention relates to an erasing method for a nonvolatile semiconductor memory device, and more particularly, to an erasing method for a nonvolatile semiconductor memory device which makes it possible to improve a threshold voltage distribution after executed an erasing operation in the nonvolatile semiconductor memory device employing a writing method with use of channel hot electrons.

As a most commonly used flash memory, there has conventionally been an ETOX (EPROM THIN OXIDE: Trademark of Intel Co.). A schematic cross sectional view of this ETOX-type flash memory cell is shown in FIG. 9. As shown in FIG. 9, on a source 1, a drain 2, and a substrate (well) 3 between the source and the drain, there is formed a floating gate 5 with a tunnel oxide 4 interposed. Further on the floating gate 5, there is formed a control gate 7 with an interlayer insulating film 6 interposed.

Description will be now given of an operational principle of the ETOX-type flash memory. In a writing operation, as shown in Table 1, a voltage Vpp (ex., 10V) is applied to the control gate 7, a reference voltage Vss (ex., 0V) is applied to the source 1, and a voltage of 6V is applied to the drain 2. Consequently, a large current flows through a channel layer, and hot electrons are generated in an area with high electric fields on the drain 2 side, by which electrons are injected into the floating gate 5. As a result, a threshold voltage is increased and writing onto a certain memory cell is executed. FIG. 10 shows a threshold voltage distribution in a written state and in an erased state. As shown in FIG. 10, threshold voltages of memory cells in the write state are 5V or more.

TABLE 1

| | Control gate 7 | Drain 2 | Source 1 | Substrate 3 |
| --- | --- | --- | --- | --- |
| Writing | 10 V | 6 V/0 V | 0 V | 0 V |
| Erasing | −9 V | Open | 4 V | 0 V |
| Reading | 5 V | 1 V | 0 V | 0 V |

In an erasing operation, as shown in FIG. 11, a voltage Vnn (ex., −9V) is applied to the control gate 7, a voltage Vpe (ex., 4V) is applied to the source 1, and the drain 2 is set to be open, so that electrons are pulled toward the source 1 side and the threshold voltage is decreased. As a result, as shown in FIG. 10, the threshold voltages of memory cells in an erased state are 0.5V to 3V. In this case, a BTBT (Band To Band Tunneling) current flows from the source 1 to the Substrate (well) 3. Upon generation of this current, hot holes and hot electrons are also generated. The hot electrons flow away to the drain 2, whereas the hot holes are pulled toward the tunnel oxide 4 side and trapped inside the tunnel oxide 4. Generally, this phenomenon is considered to be a cause of deteriorated reliability.

In a reading operation, a voltage of 1V is applied to the drain 2, and a voltage of 5V is applied to the control gate 7. Herein, if a memory cell is in an erased state and low in the threshold voltage, current flows into the memory cell and status of the memory cell is determined to be "1". If the memory cell is in a written state and high in the threshold voltage, current does not flow into the memory cell, and status of the memory cell is determined to be "0".

As described above, the operation with use of applied voltages shown in Table 1 has a problem that a BTBT current generated in the erasing operation causes deteriorated reliability of the memory cells. As one solution of this problem, there is a method of conducting, at the time of erasing, a channel erasing operation which does not generate the BTBT current. Herein, the erasing operation that pulls electrons toward the source 1 side as described above is called a "source-side erasing operation". It is noted that a writing operation and a reading operation in the case of conducting the channel erasing operation are identical to the case of conducting the source-side erasing operation.

Hereinbelow, description will be made of the channel erasing operation. Table 2 shows voltage application conditions in each writing, erasing, and reading access to ETOX-type flash memory cells in the case of conducting the channel erasing operation.

TABLE 2

| | Control gate 7 | Drain 2 | Source 1 | p Well 8 |
| --- | --- | --- | --- | --- |
| Writing | 10 V | 6 V/0 V | 0 V | 0 V |
| Erasing | −9 V | Open | 7 V | 7 V |
| Reading | 5 V | 1 V | 0 V | 0 V |

In the above channel erasing, as shown in FIG. 12, a voltage Vnn (ex., −9V) is applied to the control gate 7, and a voltage Vesc (ex., +7V) is applied to the source 1 and a first well (p well) 8. Consequently, strong electric fields are applied to the tunnel oxide 4 disposed between a channel layer and the floating gate 5, and due to an FN (Fowler-Nordheim) tunneling phenomenon, electrons are pulled from the floating gate 5 toward the channel side, resulting in decrease of the threshold voltage. As shown in FIG. 10, a threshold voltage distribution in a written and an erased state is approximately identical to that in the source-side erasing operation.

In this case, potential of the source 1 is equal to potential of the first well (p well: channel region) 8, so that electric fields are not concentrated onto an interface between the source 1 and the well 8, and therefore the BTBT current is not generated. As a result, hot hole trap is not generated, resulting in improved reliability of the memory cells.

However, the above-described channel erasing operation has a problem that dispersion in the threshold voltage distribution after an erasing operation, attributed to dispersion of a channel length, is larger than that in the source-side erasing operation, as indicated in "Comparison of Current Flash EEPROM Erasing Methods: Stability and How to control" IEDM Tech. Dig 1992 IEDM 92-595 (reference 1). Therefore, the channel erasing operation requires control of dispersion in the threshold voltage after executed the erasing operation.

As one solution to this problem, there is a method disclosed in "Control of Erased Flash Memory's Threshold Voltage by 2-Step Erasing Scheme", Technical Report SDM93-29 1993 of Institute of Telecommunications Engineers (reference 2). Applying this method to a memory cell structure of FIG. 12 results in applied voltage waveforms shown in FIG. 13. As shown in FIG. 13, the two-step erasing method is made up of a first step and a second step. In the first step, a voltage Vnn (ex., −9V) is applied to the control gate 7, and a voltage Vesc (ex., +7V) is applied to the source 1 and the first well (channel region) 8. In the second step, a voltage Vpcg (ex., 10V) is applied to the control gate 7, and a voltage Vpsc (ex., −7V) is applied to the source 1 and the first well (channel region) 8. An operation in the first step is identical to the normal channel erasing operation shown in FIG. 12, where the threshold voltage is decreased by the erasing operation. On the other hand, an operation in the second step is, as shown in FIG. 14, to inject electrons from a channel layer 10 into the floating gate 5 for increasing the threshold voltage. More particularly, some writing is executed to decrease dispersion in the threshold voltage of the memory cells. Hereinafter, a writing operation shown in FIG. 14 is referred to as a "channel writing operation".

FIG. 15 shows a change in the threshold voltage distribution in the tow-step erasing operation. Comparison between the change in the threshold voltage distribution in FIG. 15 and that in the normal channel erasing operation of FIG. 10 clarifies that the width of the threshold voltage distribution in the erased state is narrow and tight with the two-step erasing method. This indicates that the two-step erasing method is effective for achieving a tight threshold voltage distribution after executed the erasing operation.

The following description discusses a mechanism of the phenomenon shown in FIG. 15 with reference to FIGS. 16 and 17, and a model equation of the FN tunnel current (for detail, see the reference 2). The FN tunnel current $J_{FN}$ is expressed by an equation (1):

$$J_{FN} = A\ E^2\ \exp\left(-\frac{B}{E}\right) \quad (1)$$
$$= \left(\frac{q^3 m E^2}{8\pi \Phi m'}\right) \exp\left(\frac{-8\pi(2m')^{1/2}\Phi^{3/2}}{3hqE}\right)$$

where q represents a unit electric charge, m represents a mass of electrons, E represents electric field strength applied to an oxide, h represents the Planck's constant, $\Phi$ represents a height of a barrier, and m' represents an effective mass of electrons present in the tunnel oxide 4.

In the flash memory, exchange of electric charges between the floating gate 5 and the channel region in the case of using the FN tunnel phenomenon can be described by the above-stated current equation (1). Consequently, dispersion in the threshold voltage after executed the erasing operation and the writing operation depends on the dispersion of the FN tunnel current $J_{FN}$. Therefore, larger dispersion of the FN tunnel current $J_{FN}$ indicate larger dispersion in the threshold voltage distribution after executed the erasing and the writing operation.

FIG. 16 shows a state of an energy bandgap of the memory cell structure of FIG. 9 (a channel is formed on the substrate 3) in the channel erasing operation. FIG. 17 shows a state of an energy bandgap of the memory cell structure of FIG. 9 in the channel writing operation. In each operation, tunneling of electrons through an energy barrier ($\Phi_{FG}$ in height) of the floating gate 5 or an energy barrier ($\Phi_{sub}$ in height) of the substrate 3 occurs, by which the electrons are emitted or injected. Consequently, a value of $\Phi$ in the equation (1) is $\Phi_{FG}$ in channel erasing, and $\Phi_{sub}$ in channel writing. Specific values thereof shown in the reference 2 are as follows:

$\Phi_{FG}$=2.3 to 2.95 (experimental value)
$\Phi_{sub}$=2.7 to 2.8 (experimental value)

The reference 2 explains the reason why the height $\Phi$ of the energy barriers and the level of dispersion are different. According to the explanation, the floating gate 5 is made of polysilicon, which causes segregation of phosphorous atoms on grain boundaries in an interface between the floating gate 5 and the tunnel oxide 4. This lowers the height $\Phi_{SUB}$ of the energy barrier, and generates dispersion of the threshold voltage. On contrary to this, the height $\Phi_{SUB}$ of the energy barrier is not lowered in the substrate 3. Therefore, the threshold voltage dispersion thereof is small.

The above description proves that in the two-step erasing method, tight control of the threshold voltage distribution is achievable since the channel erasing operation causing small dispersion of the threshold voltage is conducted after the channel writing operation causing large dispersion of the threshold voltage.

However, the conventional two-step erasing method for the ETOX-type flash memory cells has a following problem. The two-step erasing method disclosed in the reference 2 targets a flash memory of hundreds K bits, and therefore applying it to a flash memory LSI (Large Scale Integrated Circuit) actually in use requires a verifying operation of the threshold voltage.

FIG. 18 shows algorithm of a normal erasing operation applied to the conventional flash memory LSI. Generally, the erasing operation is executed per block. Upon start of the erasing operation, a pre-erasing program is performed in a step S1. As a result, threshold voltages of all the memory cells within an erasing-target block are set to be 5V or more. In a step S2, an erasing pulse is applied to all the memory cells within the erasing-target block. Application conditions of the erasing pulse are as shown in Table 2, according to which a voltage Vnn (ex., −9V) is applied to the control gate 7, and a voltage Vesc (ex., +7V) is applied to the source 1 and the channel region, lowering the threshold voltage to 3V or less. In a step S3, verification of the threshold voltage is performed to verify if the threshold voltages of the memory cells within the erasing-target block are all set to be 3V or less. In a step S4, it is determined as a result of the threshold voltage verification if the threshold voltages of all the bits (memory cells) are 3V or less. If it is determined that the threshold voltages of all the bits are not 3V or less, the procedure returns to the step S2, and application of the erasing pulse is repeated. If it is determined that the threshold voltages of all the bits are 3V or less, the erasing operation of the block is terminated. Thus, application of the erasing pulse and verification are performed alternately as the erasing operation till the threshold voltages of all the bits become 3V or less. Such an erasing method is also disclosed in Japanese Patent Laid-Open Publication HEI No. 9-320282.

Next, description will be given of the normal erasing operation of the flash memory LSI shown in FIG. 18 with the two-step erasing method applied. FIG. 19 shows algbrism of applying the two-step erasing method to the normal erasing operation. In this case, the final object of the threshold voltage distribution after executed two-step erasing method is, as shown in FIG. 15, to be within the range of 0.5V to 2V.

In a step S11, a pre-erasing program is performed to set the threshold voltages of all the memory cells within an erasing-target block to 5V or more. In a step S12, an erasing pulse is applied (the first step). In a step S13, verification of the threshold voltage is performed. In a step S14, it is determined as a result of the threshold voltage verification if the threshold voltages of all the bits are 1.5V or less. If it is determined that the threshold voltages of all the bits are 1.5V or less, the procedure proceeds to a step S15. If not, the procedure returns to the step S12, and application of the erasing pulse is repeated. Thus, application of the erasing pulse and verification are performed alternately till the threshold voltages of all the bits are determined to be 1.5V or less.

In the step S15, a program pulse is applied (the second step). In a step S16, verification of the threshold voltage is performed. In a step S17, it is determined as a result of the threshold voltage verification if the threshold voltages of all the bits are 0.5V or more. If it is determined that the threshold voltages of all the bits are not 0.5V or more, the procedure returns to the step S15, and application of the program pulse is repeated. If it is determined that the threshold voltages of all the bits are 0.5V or more, the erasing operation of the block is terminated. Thus, application of the program pulse and verification are performed alternately as the erasing operation till the threshold voltages of all the bits become 0.5V or more.

The following description discusses a problem of the erasing operation shown in FIG. 19. FIG. 20 is a schematic view showing a memory cell array connected to one bit line BL in a NOR-type flash memory. Reference numeral M0, M1, M2, and M3 represent memory cells constituting a memory cell array. Drains of each memory cell M0, M1, M2, and M3 are connected to a common bit line BL, while sources thereof are connected to a common source line S. These memory cells M0, M1, M2, and M3 belong to the same block and accept collective erasing. A control gate of the memory cell M0 is connected to a word line WL0. Likewise, each control gate of the memory cells Ml, M2, and M3 is connected to word lines WL1, WL2, and WL3.

The bit line BL is connected to one input terminal of a sense amplifier SA. In the other input terminal of the sense amplifier SA, there is inputted a reference voltage Vref. The sense amplifier SA determines whether potential of the bit line BL is higher or lower than the reference voltage Vref, and outputs a voltage Vout indicating a determination result from an output terminal.

It is noted that FIG. 20 is simplified to describe the verifying operation in the erasing process. In reality, for writing and reading access to memory cells M, there is connected a voltage supply circuit for applying a writing voltage and a reading voltage to the bit line BL. There is also required a means for setting the bit line BL to a high impedance state in the erasing process. Description of these means are omitted in FIG. 20.

In FIG. 20, there is first performed a pre-erasing program (pre-erasing writing) of the memory cells M0 to M3 within a block according to the erasing operation algorism of FIG. 19. Consequently, the threshold voltages of the memory cells M0 to M3 are set to 5V or more. Next, after an erasing pulse is applied, verification is executed to verify whether the threshold voltages of all the memory cells M0 to M3 become 1.5V or less. Thereafter, application of the erasing pulse and verification are repeated. When the threshold voltages of the all the memory cells M0 to M3 within the block become 1.5V or less, the first step of the erasing operation is terminated. The operation stated hereinabove shall provide the threshold voltage distribution after the first step shown in FIG. 15.

However, the memory cells M have dispersion in erasing characteristics. Consequently, though the same erasing pulse is applied, some memory cells are fast in decrease of the threshold voltage (erase-fast memory cell), while some memory cells are slow in decrease of the threshold voltage (erase-slow memory cell), and these memory cells are mixed-present in the same block. It is assumed that a memory cell M3 in FIG. 20 is the most erase-fast memory cell, and a memory cell M0 is the most erase-slow memory cell.

As shown in FIG. 15, a distribution width of the threshold voltages of the memory cells M that are ago collectively erased within a block in the first step is approximately 2.5V. Therefore, if the most erase-slow memory cell MO obtains a threshold voltage of 2.3V as a result of being applied the erasing pulse once or plural times in the first step, the most erase-fast memory cell M3 obtains a negative threshold voltage of −0.2V (=2.3V−2.5V).

In this state, verification is performed. In the verifying operation, word lines WLs are selected in sequence, and a voltage of 1.5V is applied to a selected word line WL, while a voltage of 0V is applied to unselected word lines WLs. In principle, when a word line WL0 is selected and a voltage of 1.5V is applied thereto, and a voltage of 0V is applied to unselected word lines WL1 to WL3, a cell current is not passed since the threshold voltage of the memory cell M0 is 2.3V as stated above. Accordingly, it is determined from the output voltage Vout of the sense amplifier SA that the threshold voltage of M0 is 1.5V or more.

In reality, however, the threshold voltage of the memory cell M3 is −0.2V, so that a word line WL3, though unselected (applied voltage is 0V), passes a cell current. As a result, even though the threshold voltage of the memory cell M0 is 2.3V, it is misdetermined to be 1.5V or less. This leads to a false determination that the first step is terminated.

In this case, with presence of the memory cell M0 having a threshold voltage of 2.3V, the procedure proceeds to the second step, where application of a program pulse is executed. As a result, a memory cell M having a threshold voltage of 2V or more is present after the second step, which disturbs the normal erasing operation. In the case where the normal two-step erasing is performed, the threshold voltage distribution is within the range of 0.5V to 2V, and the threshold voltages of all the memory cells M0 to M3 within the same block fall within 2V or less.

SUMMARY OF THE INVENTION

Accordingly, an object of the present invention is to provide an erasing method for a nonvolatile semiconductor memory device enabling normal erasing which makes a distribution of threshold voltages tight and within the range of 2V or less.

In order to achieve the above object, there is provided an erasing method for a nonvolatile semiconductor memory device comprising: floating-gate field-effect transistors, which have a control gate, a floating gate, a drain, and a source, and enable electric writing and erasing of information, disposed in a matrix configuration on a substrate or on a well; a plurality of row lines connected to the control gate of each floating-gate field-effect transistor arrayed in a row direction; and a plurality of column lines connected to the drain of each floating-gate field-effect transistor arrayed in a column direction, the source of each floating-gate field-effect transistor constituting a block being connected in common, wherein the erasing operation is conducted in the block units with use of a Fowler-Nordheim tunneling phenomenon; and comprises a first step for lowering threshold voltages of all the floating-gate field-effect transistors within the block to a voltage higher than 0, and equal to or lower than a first specified voltage in an erased state; a second step for lowering the threshold voltages to a voltage equal to or lower than a second specified voltage that is lower than the first specified voltage; and a third step for raising the threshold voltages to a voltage higher than 0.

According to the above structure, in the first step of erasing, the threshold voltages of all the floating-gate field-effect transistors within a block are lowered to a voltage higher than 0, and equal to or lower than a first specified voltage in an erased state. In that case, since each threshold voltage is higher than 0, it is possible to perform a verifying operation for a plurality of floating-gate field-effect transistors whose drains are connected on the same column line, and whose sources are connected in common, for verifying with accuracy that all the threshold voltages are in an erased state. In the second step, the threshold voltages are sufficiently lowered to a voltage equal to or lower than the second specified voltage that is lower than the first specified voltage. Accordingly, in the next third step, the threshold voltages are raised to a voltage higher than 0, which enables normal erasing in which a distribution of the threshold voltages is tight and falls within 2V or less.

In the second step, the verifying operation can be omitted since all the threshold voltages are already in an erased state in the first step. Therefore, even if the threshold voltage of an erase-fast floating-gate field-effect transistor is lowered to a negative value, a conventional problem relating to a false determination accompanied by the verifying operation does not occur.

In one embodiment of the present invention, the first step includes an applying operation of a first erasing pulse for lowering the threshold voltages, and a verifying operation for verifying lowered threshold voltages.

According to the above structure, the verifying operation is performed every time the first erasing pulse is applied to each of the floating-gate field-effect transistors. Application of the first erasing pulse is repeated till it is verified that each threshold voltage becomes equal to or less than the first specified voltage.

In one embodiment of the present invention, a reference voltage used in the verifying operation is higher than an upper limit voltage in a distribution of the threshold voltages finally obtained by the erasing operation.

According to the above structure, in the first step, an upper limit voltage in a distribution of the threshold voltages is set to be higher than an upper limit voltage in an distribution of the threshold voltages finally obtained by the erasing operation, which prevents a lower limit voltage from becoming a negative voltage. Thus, the verifying operation of a plurality of floating-gate field-effect transistors whose drains are connected on the same column line, and whose sources are connected in common is executed with accuracy.

In one embodiment of the present invention, the second step includes an applying operation of a second erasing pulse for lowering the threshold voltages, and excludes a verifying operation for verifying lowered threshold voltages.

According to the above structure, in the second step, the threshold voltages lowered in the first step are further lowered through application of a second erasing pulse. Therefore, even if the threshold voltage of an erase-fast floating-gate field-effect transistor is lowered to a negative value, a conventional problem relating to a false determination accompanied by the verifying operation does not occur.

In one embodiment of the present invention, number of application of the second erasing pulse is N (positive integer number) times as large as number of application of the first erasing pulse, and the threshold voltages upon termination of the second step are lower than an upper limit voltage in a distribution of the threshold voltages finally obtained by the erasing operation.

According to the above structure, in the second step, the second erasing pulse is applied N times as large as the number of application of the first erasing pulse, and the threshold voltages are set to be lower than an upper limit voltage in the threshold voltage distribution finally obtained by the erasing operation. Even without the verifying operation, specifying the optimum N value makes it possible that the threshold voltages, when raised in the next third step, provide a desired threshold voltage distribution.

In one embodiment of the present invention, assumed that number of application of the first erasing pulse is i, total application time of the second erasing pulse is (i×N) times as large as a pulse width of the first erasing pulse.

According to the above structure, in the second step, there is obtained an effect identical to that in the case where application of the second erasing pulse is conducted N times the number of application of the first erasing pulse.

In one embodiment of the present invention, the total application time of the second erasing pulse in the second step is divided by a pulse width of one or a plurality of the second pulses.

According to the above structure, in the second step, division number of the total application time of the above pulse is decreased so that the number of application of the second erasing pulse is reduced. This can eliminate a waste of time and power consumption due to charging and discharging of a well current, a source current, and a gate current.

In one embodiment of the present invention, the pulse width of the second erasing pulse by which the total application time of the pulse in the second step is divided is N times as large as a pulse width of the first erasing pulse, and pulse number of the second erasing pulse is i.

The above structure facilitates making the threshold voltage distribution tight and lower than a desired upper limit value.

In one embodiment of the present invention, the third step includes an applying operation of a writing pulse for raising the threshold voltages, and a verifying operation for verifying raised threshold voltages.

According to the above structure, the verifying operation is executed every time the writing pulse is applied to each of the floating-gate field-effect transistors. Application of the writing pulse is repeated till it is verified that each threshold voltage becomes higher than 0.

In one embodiment of the present invention, a reference voltage used in the verifying operation is a lower limit voltage in a distribution of the threshold voltages finally obtained by the erasing operation.

According to the above structure, in the third step, a lower limit voltage in a distribution of the threshold voltages is set with accuracy equal to or higher than a lower limit voltage in a distribution of the threshold voltages finally obtained by the erasing operation.

In one embodiment of the present invention, an absolute value of a pulse voltage of at least either the first erasing pulse or the second erasing pulse is raised by an absolute value of a specified voltage whenever application is executed.

According to the above structure, an absolute value of a voltage of the above erasing pulse is raised by an absolute value of a specified voltage whenever application is executed. Therefore, compared to the case of applying the erasing pulse with a constant voltage, time taken for lowering the threshold voltages to a specified voltage, and consequently erasing time are shortened.

In one embodiment of the present invention, absolute values of pulse voltages of the first erasing pulse and the second erasing pulse are raised whenever application is executed, an absolute value of a pulse voltage of the second erasing pulse applied first in the second step is a value obtained by adding an absolute value of the specified voltage to an absolute value of a pulse voltage of the first erasing pulse applied last in the first step.

According to the above structure, a simple processing of repeating the same procedure from the first step to the second step shortens time taken for lowering each threshold voltage to the second specified voltage or less.

In one embodiment of the present invention, lowering of the threshold voltages in the first step and the second step is implemented by pulling electrons from the floating gate of all the floating-gate field-effect transistors within the block toward a channel side.

According to the above structure, in the first and the second steps, so-called channel erasing is executed. Consequently, unlike the case of executing so-called source-side erasing which pulls electrons from a floating gate to a source side, there is no generation of a hot hole trap attributed to a BTBT current generated between the source and the well, resulting in improved reliability of memory cells composed of the floating-gate field-effect transistors.

In one embodiment of the present invention, raising of the threshold voltages in the third step is implemented by injecting electrons from a channel side to the floating gate of all the floating-gate field-effect transistors within the block.

According to the above structure, dispersion in the threshold voltage distribution generated by channel erasing in the first and the second steps is reduced by injection of electrons, i.e. a writing operation, from the channel side to the floating gate in the third step. Thus, erasing for obtaining a tight threshold voltage distribution is performed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

First Embodiment

Figure 1:
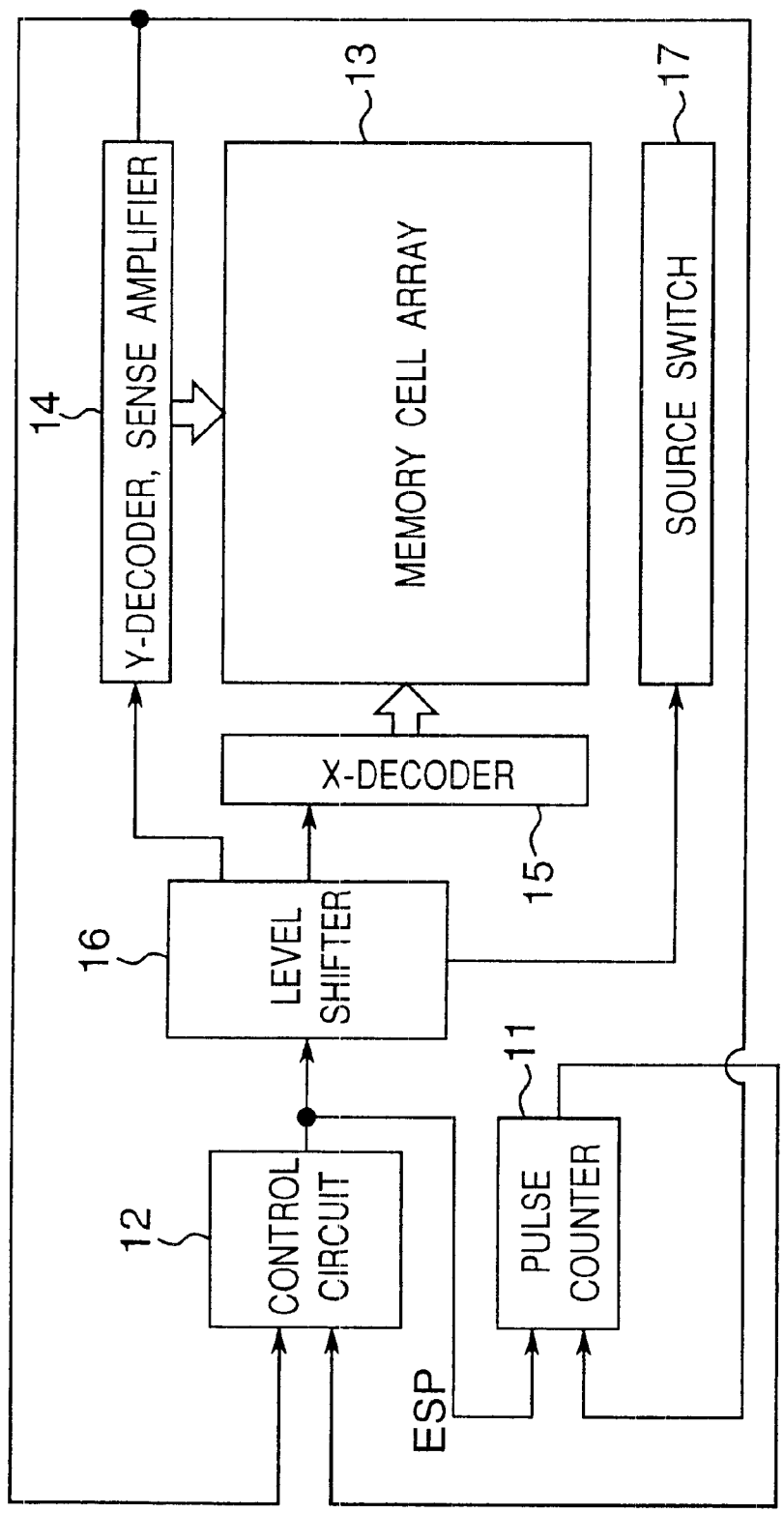
FIG. 1 is a block diagram showing a flash memory device with the erasing method for the nonvolatile semiconductor memory device of the present invention applied.

Hereinbelow, the embodiments of the present invention will be described in detail with reference to the accompanying drawings. FIG. 1 is a block diagram showing a flash memory device with the erasing method for the nonvolatile semiconductor memory device of the present invention applied. The flash memory device is different from an ordinary flash memory device in the point that a pulse counter is provided. The pulse counter 11, described in detail later, counts number of the erasing pulses applied in response to an erasing pulse signal ESP and a reset signal outputted from a control circuit 12 in the first step during the erasing operation, and outputs the result of counting to the control circuit 12. It is noted that reference numeral 13 denotes a memory cell array, and 14 denotes a source driver incorporating a Y-decoder including a drive circuit for applying a voltage to each bit line upon receiving a control signal form the control circuit 12, as well as a sense amplifier connected to each bit line. The reference numeral 15 denotes a gate driver incorporating an X-decoder including a drive circuit for applying voltages to each word line upon receiving a control signal from the control circuit 12. The reference numeral 16 is a level shifter for conducting level conversion of the control signal from the control circuit 12 to a voltage for reading, erasing, and writing operations (ex., 10V), and outputting the voltage. The reference numeral 17 denotes a source switch to select a common source line.

Table 3 indicates conditions of applied voltages in writing, erasing, and reading modes of the flash memory device in the present embodiment.

TABLE 3

|  | Control Gate | Drain | Source | p Well |
|---|---|---|---|---|
| Writing | 10 V | 6 V/0 V | 0 V | 0 V |
| Erasing (1st step) | −9 V | Open | 7 V | 7 V |

TABLE 3-continued

|  | Control Gate | Drain | Source | p Well |
|---|---|---|---|---|
| Erasing (2nd step) | −9 V | Open | 7 V | 7 V |
| Erasing (3rd step) (Channel writing) | 10 VF | Open | −7 V | −7 V |
| Reading | 5 V | 1 V | 0 V | 0 V |

Figure 12:
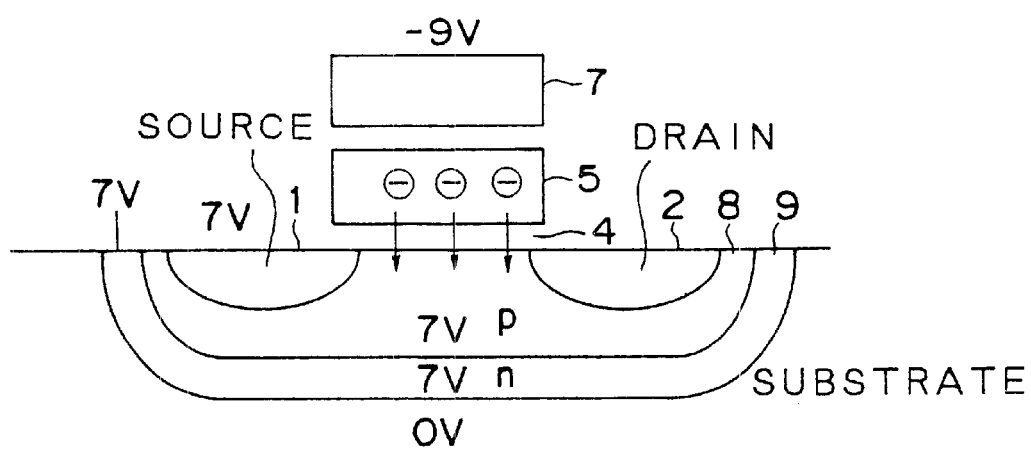
FIG. 12 is a view showing an operation in conventional channel erasing.
Figure 13A:
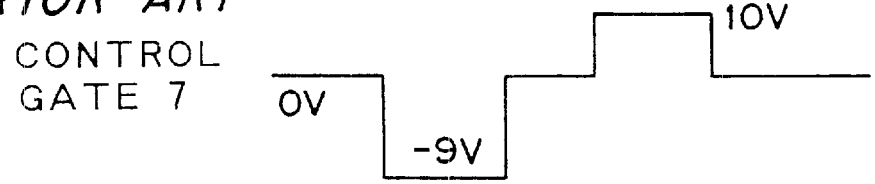
FIG. 13A and 13B are views each showing an applied voltage waveform in the case of applying the two-step erasing method to the memory cell structure of FIG. 12.
Figure 13B:
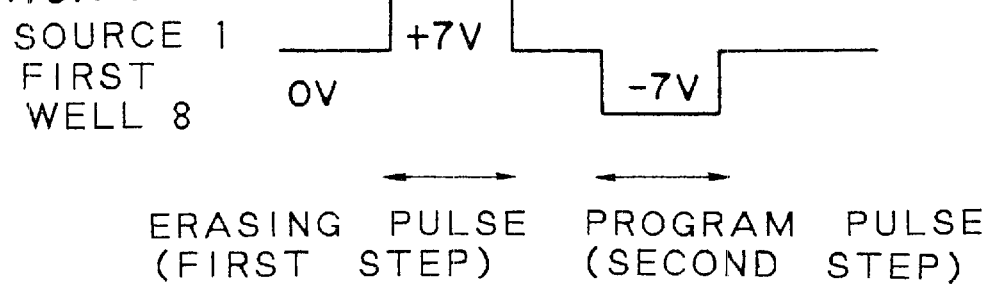
Figure 14:
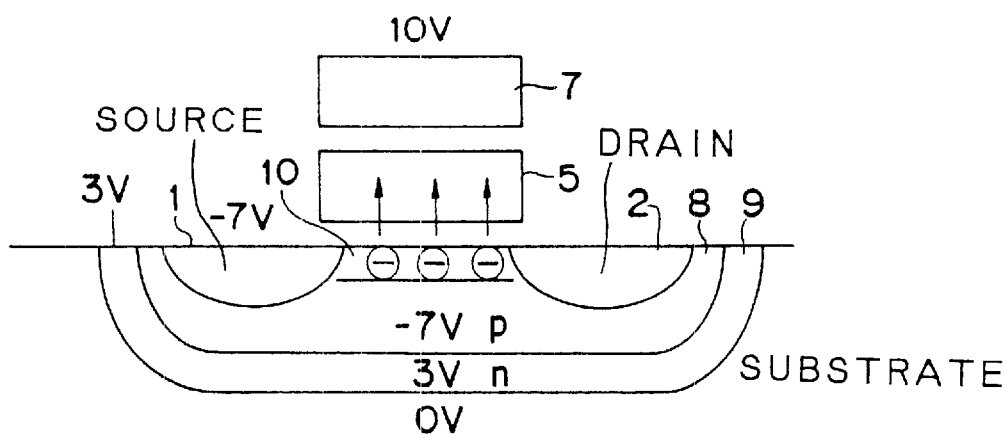
FIG. 14 is a schematic view showing an operation in channel writing in the case of applying the two-step erasing method to the memory cell structure of FIG. 12.
Figure 15:
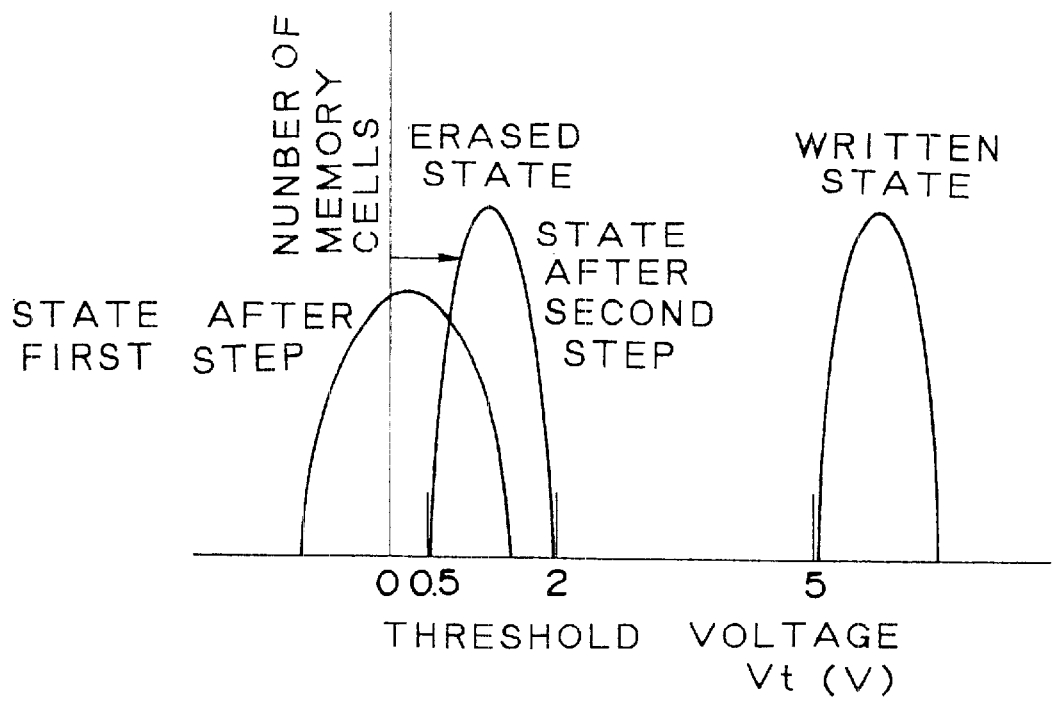
FIG. 15 is a view showing a change in the threshold voltage distribution in the case of applying the two-step erasing method to the memory cell structure of FIG. 12.
Figure 16:
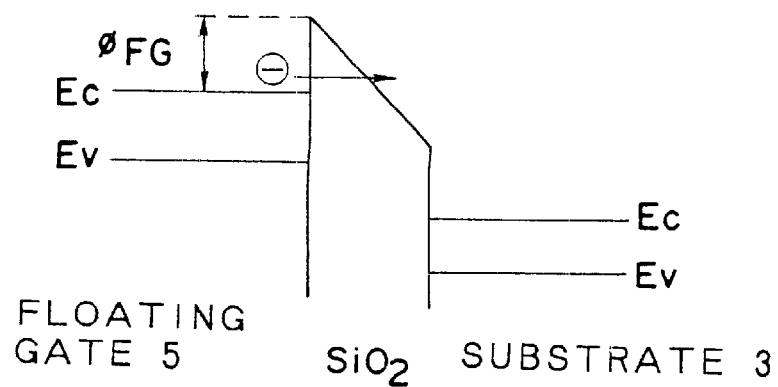
FIG. 16 is a view showing a state of an energy bandgap in the memory cell structure of FIG. 9 in the channel erasing operation.
Figure 17:
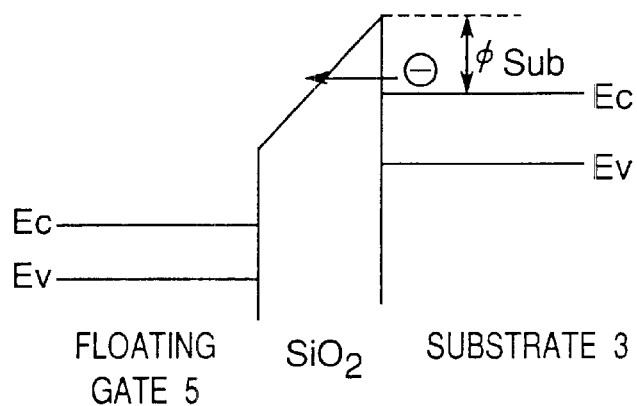
FIG. 17 is a view showing a state of an energy bandgap in the memory cell structure of FIG. 9 in the channel writing operation.
Figure 18:
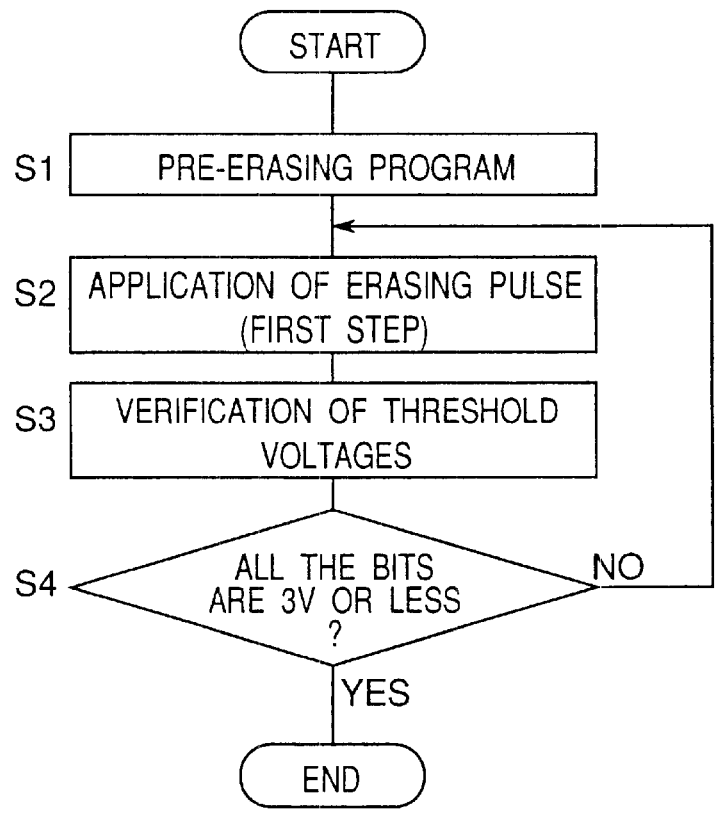
FIG. 18 is a flow chart showing a normal erasing operation of a conventional flash memory LSI.
Figure 19:
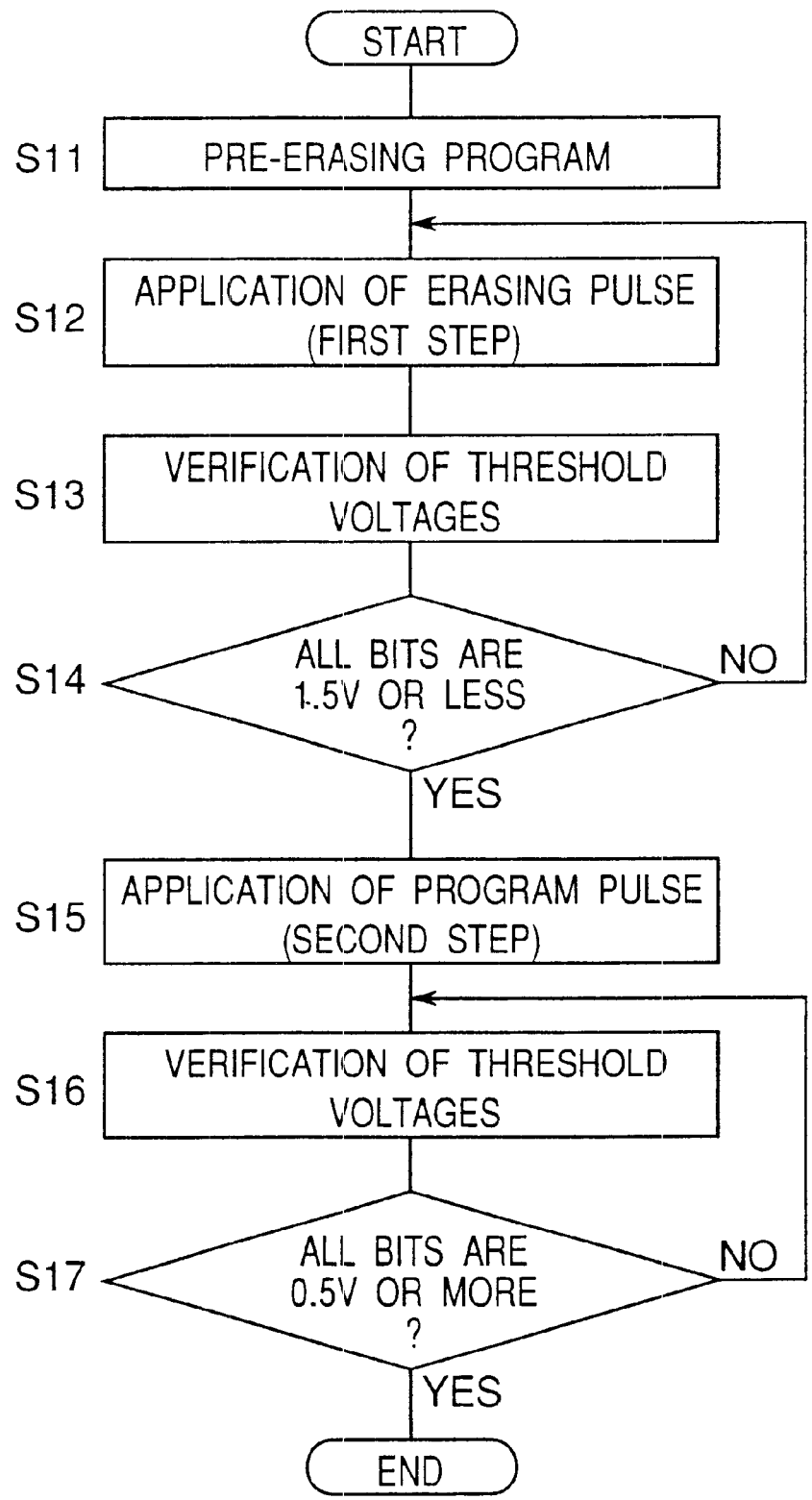
FIG. 19 is a flow chart in the case of applying the two-step erasing method to the normal erasing operation shown in FIG. 18.

Each memory cell constituting the memory cell array 13 has a double well structure composed of a first well (p well) and a second well (n well) as shown in FIG. 12 (this kind of structure is generally called a triple well structure). As shown in Table 3, in the erasing operation (first step), a voltage Vnn (ex., −9V) is applied to a control gate of a memory cell via a word line, and a voltage Verc (ex., +7V) is applied to a source and a first well (channel region). Since the erasing operation in the first step is a channel erasing, the drain is set to be open and collective erasing of a whole block is executed.

Figure 2:
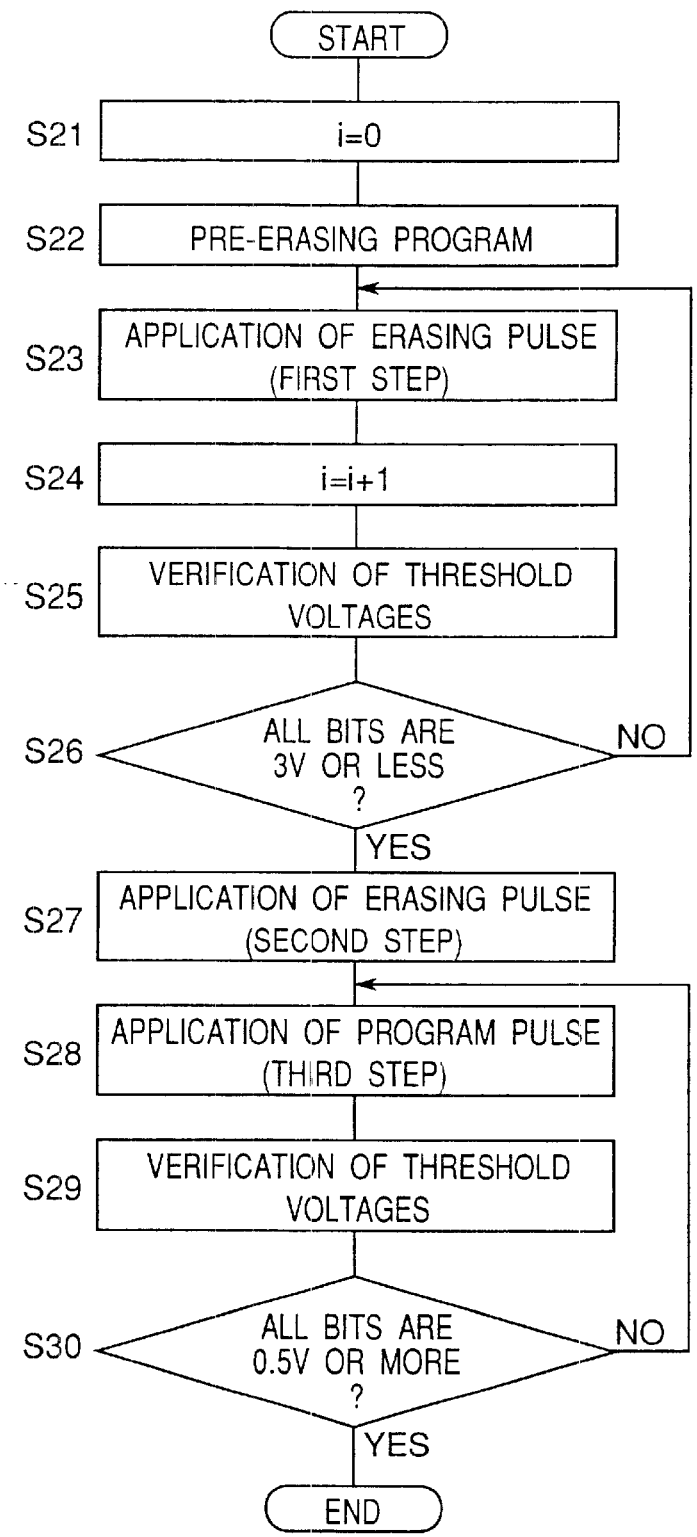
FIG. 2 is a flow chart showing an erasing operation executed by the flash memory device shown in FIG. 1.

FIG. 2 shows an algorism of an erasing operation executed by the flash memory device shown in FIG. 1. Hereinbelow, the erasing operation in this embodiment will be described in detail with reference to FIG. 2. In a step S21, the count value i of the pulse counter 11 is initialized to "0" by a reset signal from the control circuit 12. In a step S22, a pre-erasing program is executed for all the memory cells within an erasing-target block. As a result, threshold voltages of all the memory cells are set to 5V or more.

In a step S23, an erasing pulse is applied to all the memory cells within the erasing-target block (the first step). The term "erasing pulse" is herein used as a general term to refer to a control gate applied pulse, a source applied pulse, and a first well applied pulse. In a step S24, the count value i of the pulse counter 11 is incremented. In a step S25, verification of the threshold voltage is performed. In a step S26, it is determined as a result of the threshold voltage verification whether the threshold voltages of all the bits are 3V or less. If it is determined that the threshold voltages of all the bits are 3V or less, the procedure proceeds to a step S27. If not, the procedure returns to the step S23, and application of the erasing pulse is repeated. Thus, application of the erasing pulse and verification are performed alternately till the threshold voltages of all the bits are determined to be 3V or less to set all the memory cell in the block to 3V or less.

Figure 20:
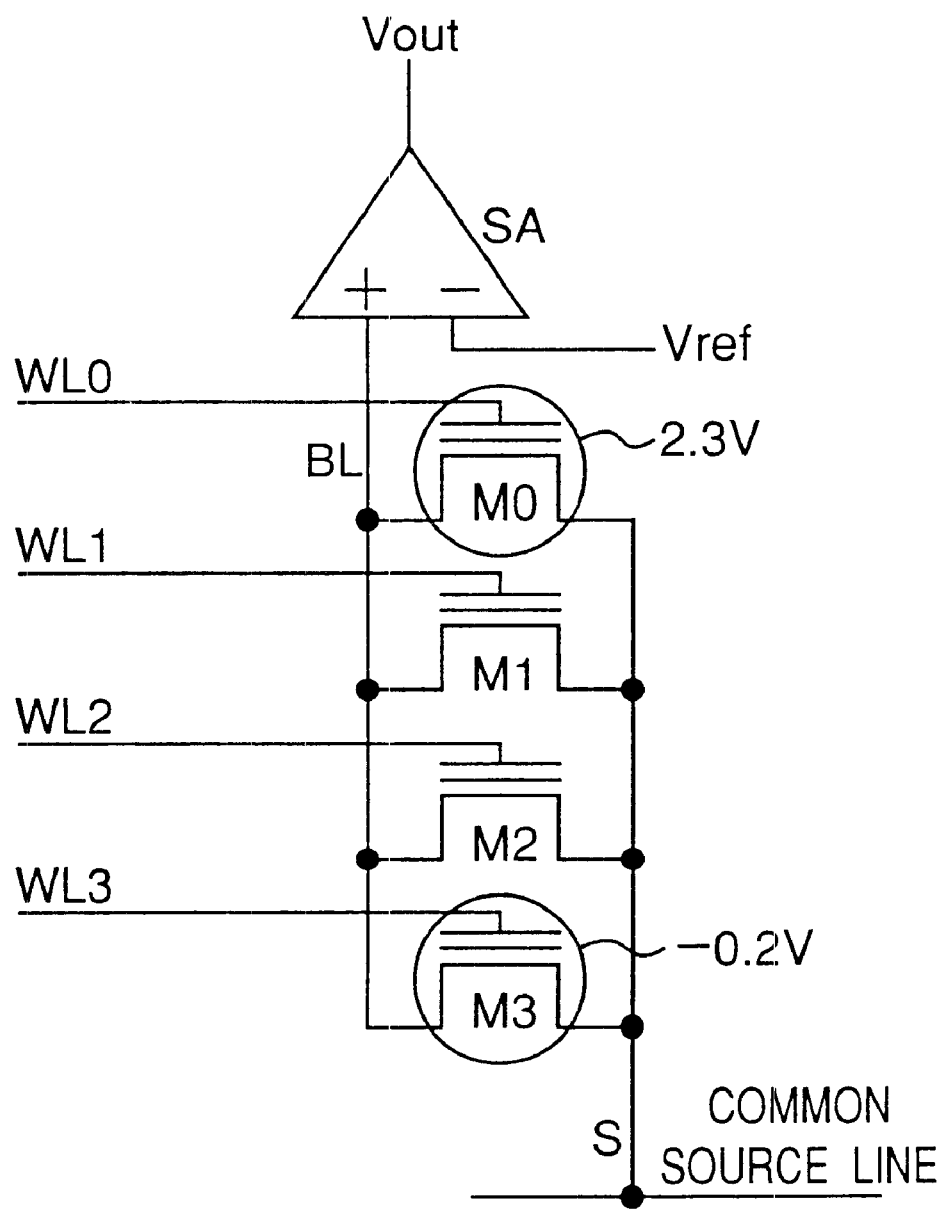
FIG. 20 is a schematic view showing a memory cell array of a NOR-type flash memory.

The reason why the verification level of the threshold voltages of all the memory cells in the first step is set to 3V is as follows. As described above, in a NOR-type flash memory as shown in FIG. 20, if any one of the memory cells M0, M1, M2, and M3 whose drains are connected to the same bit line BL and whose sources are connected to one common source line S has a negative threshold voltage, a cell current flows and normal verification is disturbed. On the other hand, a distribution width of the threshold voltages is 2.5V because of erasing characteristics of the memory cells. Accordingly, setting the verification level to 3V makes it possible to prevent even the most erase-fast memory cell from taking a negative threshold voltage. This enables normal verification of a plurality of memory cells connected to the same bit line BL and the common source line S.

It would be understood that although the verification level is set to 3V in the present embodiment, the level is not limited to this value and proper change may be made in consideration of erasing characteristics of memory cells including dispersion of the threshold voltages.

Figure 3:
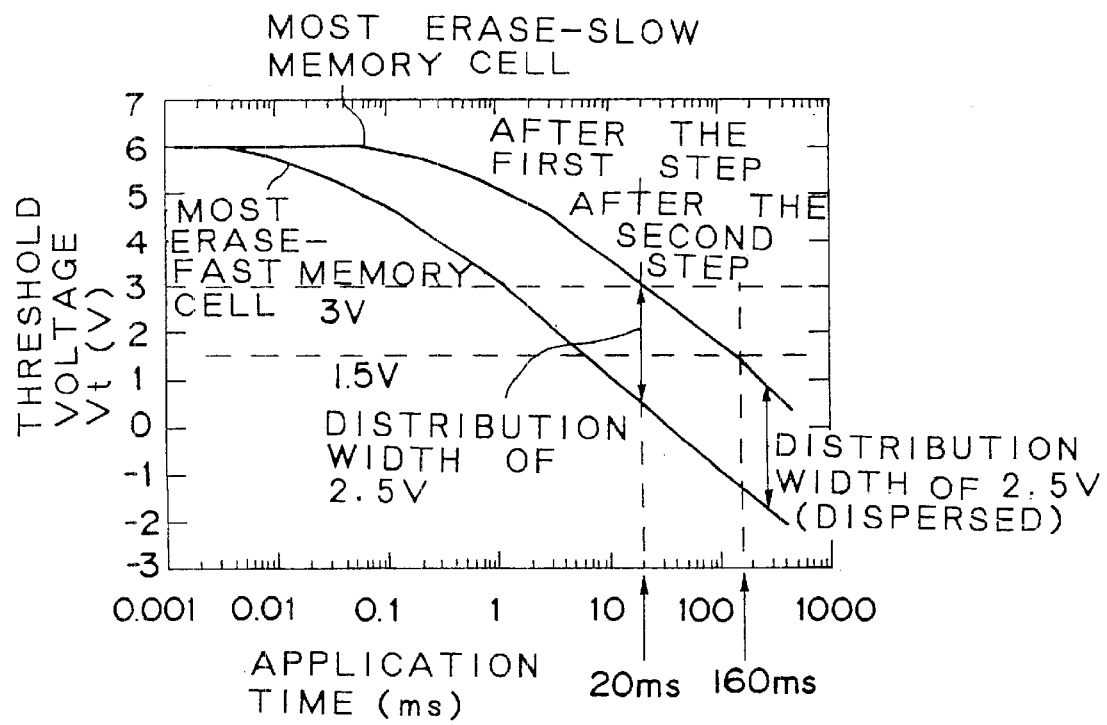
FIG. 3 is a view showing erasing characteristics of the memory cell of FIG. 1 corresponding to erasing pulse application time.

FIG. 3 shows erasing characteristics of the memory cells. If a width of the erasing pulse used in the erasing operation in the flash memory device is set to 10 ms, total application time of 20 ms is necessary for lowering the threshold voltage of the most erase-slow memory cell to 3V or less. This indicates that application of the erasing pulse should be implemented twice (total application time=20 ms). In this case, therefore, the number of erasing pulse application in the first step is set to 2. It means that in the step S23, the count value i of the pulse counter 11 is normally set to "2".

Thus, the procedure shifts to the second step. In the step S27, an erasing pulse is applied (second step). The number of application in that case is N time (ex., 7 times: the number is different by the structure of a memory cell and a coupling ratio) the count value i in the above- stated first step. It is noted that in this embodiment, the count value i is set to "2" as described above, so that the erasing pulse is already applied for 20 ms (=10 ms×2). The number of application of the erasing pulse in the second step is 14 (2×7), and total pulse application time thereof in the first and the second steps is 160 ms. As a result, as FIG. 3 indicated, even the most erase-slow memory cell gains a desired threshold voltage of 1.5V. Accordingly, the erasing operation of the second step is terminated upon application of the erasing pulse for (i×N) times, without execution of a verifying operation. It is noted as shown in Table 3, conditions of the applied voltages in the second step are identical to that in the first step.

Herein, a value N shall be determined such that all the memory cells including an erase-slow memory cell within an erasing-target block have threshold voltages of 1.5V or less in consideration of the structure of the memory cells, a coupling ratio, and erasing characteristics of the memory cells.

In that case, since a width of the threshold voltage distribution is 2.5V as stated above, an erase-fast memory cell has a negative threshold voltage. However, verification is not conducted in the second step, therefore there occures no misconduct that normal verification can not be achieved by the presence of a memory cell with a negative threshold voltage.

Thus, the procedure shifts to the third step. In a step S28, a program pulse is applied. The term "program pulse" is herein used as a general term to refer to a control gate applied pulse, a source applied pulse, and a first well applied pulse. In the third step, some writing is executed to increase threshold voltages of the memory cells, so that the dispersion in the threshold voltages of the memory cells within a block is controlled and a width of the threshold voltage distribution is narrowed. In other words, a channel writing is conducted. Table 3 shows conditions of the applied voltages in the channel writing, where a voltage Vpcg (ex., 10V) is applied to a control gate via a word line, a voltage Vpsc (ex., −7V) is applied to a source and a first well (channel region), while a drain is set to be in an open state. This enables collective writing onto the memory cells within the block. Thus, electrons are injected from the channel region into a floating gate, resulting in slight increase of the threshold voltages.

In a step S29, verification of the threshold voltages are performed. In a step S30, it is determined as a result of the threshold voltage verification if the threshold voltages of all the bits (memory cells) are 0.5V or more. If it is determined that the threshold voltages of all the bits are not 0.5V or more, the procedure returns to the step S28, and application of the program pulse is repeated. If it is determined that the threshold voltages of all the memory cells are 0.5V or more, the erasing operation of the block is terminated. Thus, application of the program pulse and verification are performed alternately till the threshold voltages of all the memory cells become 0.5V or more.

Figure 4:
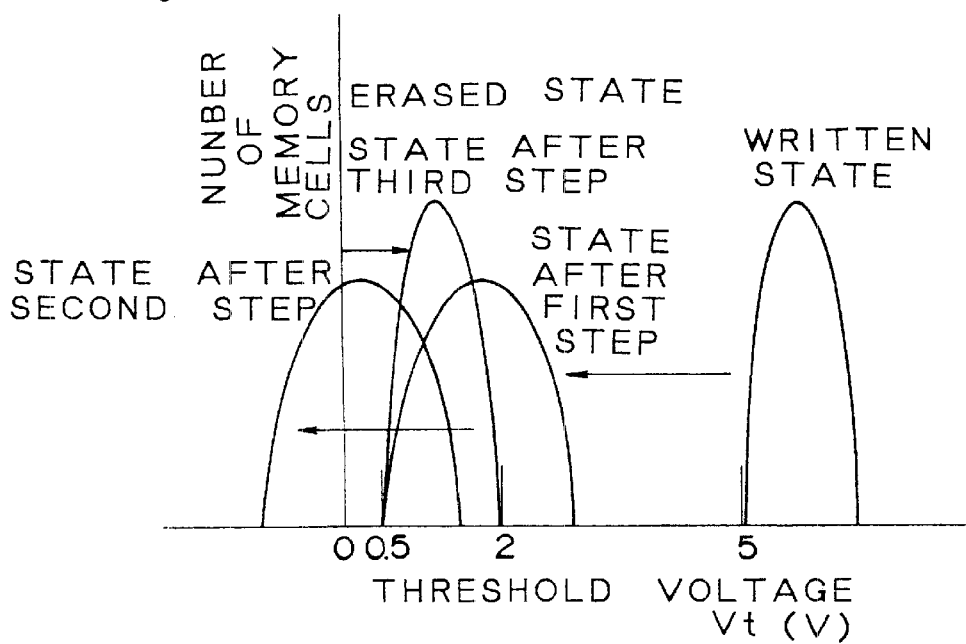
FIG. 4 is a view showing a change in the threshold voltage distribution in the erasing operation of FIG. 2.

FIG. 4 shows a change in the threshold voltage distribution in each step during the erasing operation in the present embodiment. As shown in FIG. 4, the threshold voltages, which are dispersed within the range of 2.5V after the first and the second steps, falls within the range of 1.5V after the third step. The reason why a channel writing provides a tight threshold voltage distribution has been described in the Background of Invention.

In this embodiment, as stated above, the pulse counter 11 is provided in the flash memory device for counting the number of erasing pulse application in the first step during the erasing operation. In the first step, "application of the erasing pulse" and "verification" are conducted so that the threshold voltages of all the memory cells in an erasing-target block are set to 3V or less. This implements both setting the threshold voltages of all the memory cells to 3V or less and preventing generation of a memory cell with a negative threshold voltage in the same block. Consequently, accurate verification is conducted, which ensures that all the memory cells in the block are brought in an erased state.

Further in the second step, "application of the erasing pulse" is executed to set the threshold voltage of the most erase-slow memory cell to 1.5V or less. Since the threshold voltage of an erase-fast memory cell becomes negative, the verifying operation is not conducted. Instead, the erasing pulse is applied N times as large as the number of application of the erasing pulse in the above-stated first step, which ensures that the threshold voltages of all the memory cells are set to 1.5V or less. The integer N is obtained in advance from FIG. 3 and a pulse width of the erasing pulse.

Further in the third step, "application of the program pulse" and "verification" are conducted as a channel writing, which ensures that the threshold voltages of all the memory cell in an erasing-target block are set to 0.5V or more. This makes a distribution of the threshold voltages of all the memory cells tight and within 2V or less.

According to the present embodiment, therefore, the channel erasing, which is executed with one step in the ordinary two-step erasing method, is executed with two steps consisting of the first step and the second step. This ensures that the threshold voltages of all the memory cells within the same block are set to 1.5V or less. As a result, with use of the ordinary channel writing, there is enabled a normal erasing which makes a distribution of the threshold voltages tight and within 2V or less.

Second Embodiment

In the above-stated first embodiment, the erasing pulse is applied in the second step N times (ex., 7 times) as large as the number i of the erasing pulse application in the first step. In that case, however, every time the erasing pulse is applied, charging and discharging with a well voltage, a source voltage and a gate voltage are necessary. Since the number of pulse application in the first embodiment is set to 14, charging and discharging are to be repeated 14 times. This charging and discharging operation is quite wasteful in terms of power consumption and time taken for execution thereof. The present embodiment is one example for eliminating such a waste.

Figure 5:
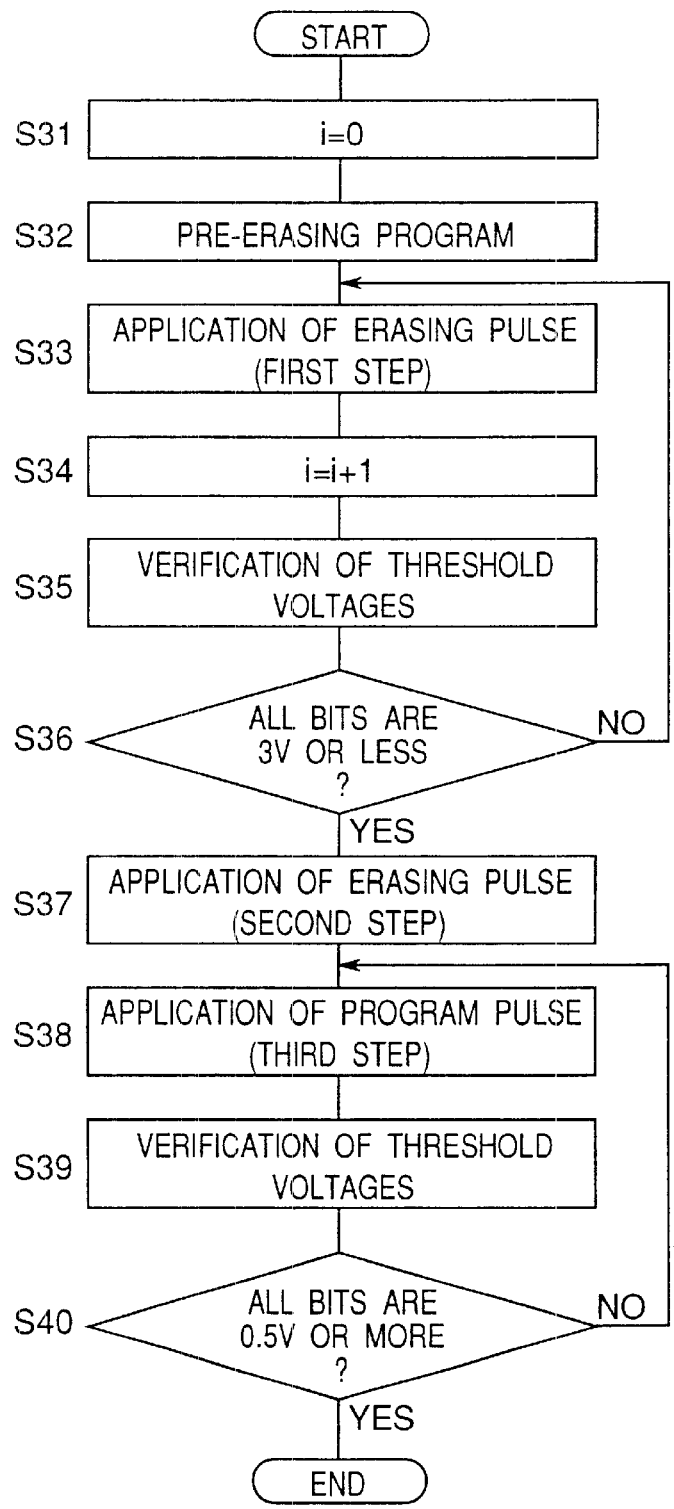
FIG. 5 is a flow chart showing an erasing operation different from that of FIG. 2.

FIG. 5 shows an algorism of an erasing operation in the present embodiment. The basic structure of the algorism shown in FIG. 5 is identical to the algorism of the erasing operation shown in FIG. 2 in the first embodiment. The algorism of the present embodiment is different from that of the first embodiment in the contents of the second step.

It is noted in the erasing operation in the above-stated first step (step S33), an erasing pulse with a pulse width Ts of 10 ms is applied i times, and total application time thereof is set to 20 ms, which is to set the threshold voltage of the most erase-slow memory cell to 3V. Consequently, the count value i of the pulse counter 11 upon termination of the first step is normally equal to "".

Next, there is conducted an erasing operation of a second step (step S37), that is a key aspect of the present embodiment. In this second step, there is applied an erasing pulse whose pulse width is different from that of the first step. Like the first embodiment, if an erasing pulse with a pulse width Ts (=10 ms) identical to that of the first step is applied N (=7) time as large as the number of pulse application i(=2) of the first step, total application time of the erasing pulse in the second step is (i×N) times as large as Ts. More particularly, the total application time of the erasing pulse is equal to 10 ms×(2×7)=140 ms. Therefore, as shown in FIG. 3, the threshold voltage of the most erase-slow memory cell can be set to 1.5V. If the total application time thereof is 140 ms, the number of application thereof can be any value.

Accordingly, in the present embodiment, the pulse width Ts of the erasing pulse is set larger by 10 ms than that of the first step for the purpose of decreasing the number of pulse application. Herein, the number of pulse application N in the second step is expressed by N=140 ms/Ts'. It is noted that Ts' refers to a pulse width in the second step. As a result, one time application of the erasing pulse with a pulse width Ts' of 140 ms makes it possible to set the threshold voltages of all the memory cells in an erasing-target block to 1.5V or less like the case of the second step of the first embodiment. In this operation, verification is not conducted like the first embodiment. In the case of applying an erasing pulse with a pulse width Ts' of 70 ms, the number of pulse application equals to 2. It is noted that selection of the pulse width Ts' and the number of pulse application N is conducted so that feasible values can be selected in consideration of a circuitry configuration and the like.

A third step in the present embodiment is identical to that in the first embodiment, and a channel writing is performed under the applied voltage conditions shown in Table 3. As a result, the threshold voltages of all the memory cells in the same block have a tight distribution within the range of 0.5V to 2V. At the same time, the threshold voltage distribution is set to 2V or less, thereby enabling a normal erasing operation.

According to the present embodiment, as stated above, the channel erasing is conducted with two steps consisting of the first step and the second step like the case of the first embodiment, which enables normal erasing that makes the threshold voltage distribution tight and within 2V or less.

Further, the number of application of the erasing pulse in the second step can be made smaller than that of the first embodiment, which can eliminate a waste of time and power consumption due to a charging and discharging operation.

Third Embodiment

In the above first and second embodiments, the total application time of the erasing pulse applied in the above first step is 20 ms, whereas the total application time of the erasing pulse applied in the second step is 140 ms, that is 7 times as large as the application time of the first step. Therefore, for realizing high-speed erasing, the application time of the erasing pulse is too long (total application time amounts to 160 ms). As a solution of such a problem, there is a voltage increment erasing method. The present embodiment relates to applying the voltage increment erasing method to the erasing operation in the above first and second steps.

Table 4 shows conditions of applied voltages in each writing, erasing, and reading mode in the present embodiment.

TABLE 4

|  | Control Gate | Drain | Source | p Well |
|---|---|---|---|---|
| Writing | 10 V | 6 V/0 V | 0 V | 0 V |
| Erasing (1st step) | −6.5 V to −12 V | Open | 7 V | 7 V |
| Erasing (2nd step) | −6.5 V to −12 V | Open | 7 V | 7 V |
| Erasing (3rd step) (Channel writing) | 10 V | Open | −7 V | −7 V |
| Reading | 5 V | 1 V | 0 V | 0 V |

Figure 6:
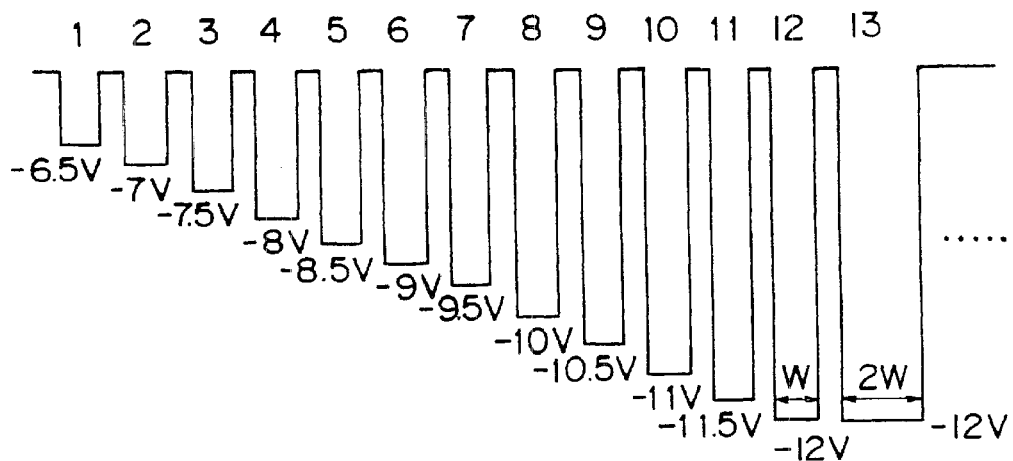
FIG. 6 is a view showing one example of pulse voltages with a voltage increment erasing method.

FIG. 6 shows one example of pulse voltages of a control gate applied pulse with a voltage increment erasing method. In FIG. 6, a pulse width W is set to, for example, 10 ms like the first embodiment. First, the voltage of a pulse applied first is set to Vnn=−6.5V. Thereafter, the voltage is lowered by, for example, 0.5V every time application is made to implement erasing. Thus, an is absolute value of an applied voltage to a control gate is set higher than the case of the first and the second embodiments, which shortens application time of the erasing pulse, and increases a speed of the erasing operation of the memory cells. In this operation, a first value of the voltage Vnn is set to be an absolute value lower than −9V of the first embodiment, which provides such effect as decreasing stresses on a tunnel oxide and the like, and improving reliability. It is noted that voltage conditions of other erasing pulses are shown in Table 4.

Figure 7:
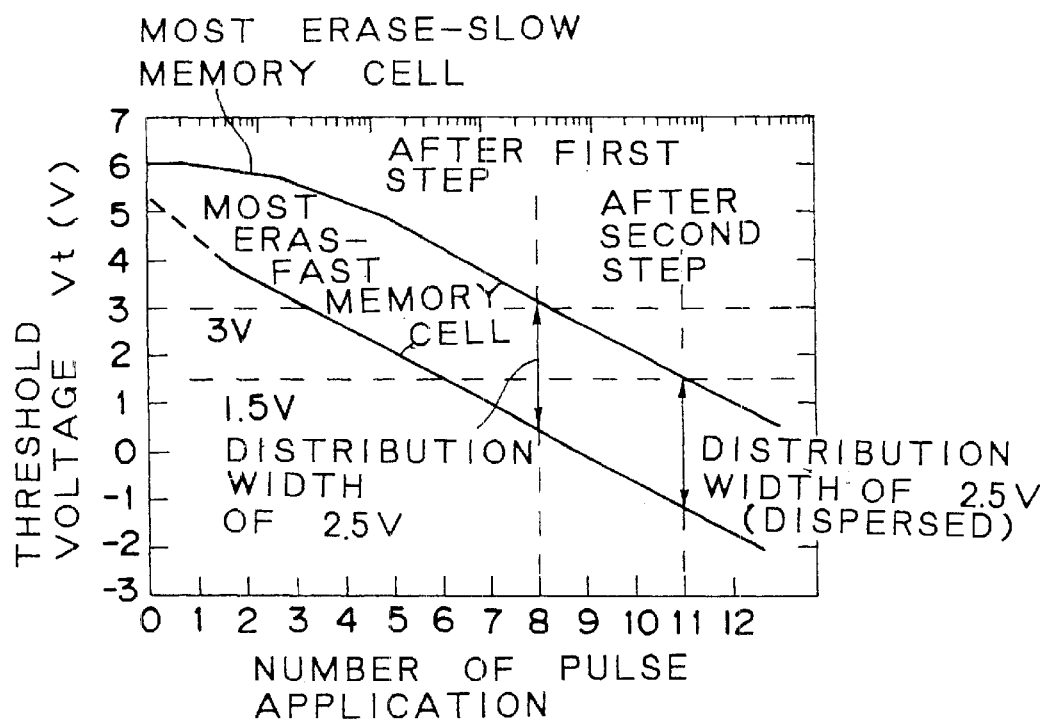
FIG. 7 is a view showing erasing characteristics of a memory cell corresponding to number of application of the erasing pulse with the pulse voltages shown in FIG. 6.

A lower limit of the voltage Vnn is set to be a voltage (ex., −12V) that does not affect a resisting voltage of an insulating film and the like. When the voltage of an applied pulse reaches the lower limit voltage of −12V, the voltage is not changed thereafter and voltage application is repeated with an increased pulse width of 2W. Thus, degradation of reliability is controlled as much as possible by preventing application of the voltage higher than the above resisting voltage. Erasing characteristics in this operation are shown in FIG. 7. As shown in FIG. 7, the threshold voltages are lowered by 0.5V with every one application of the pulse.

Figure 8:
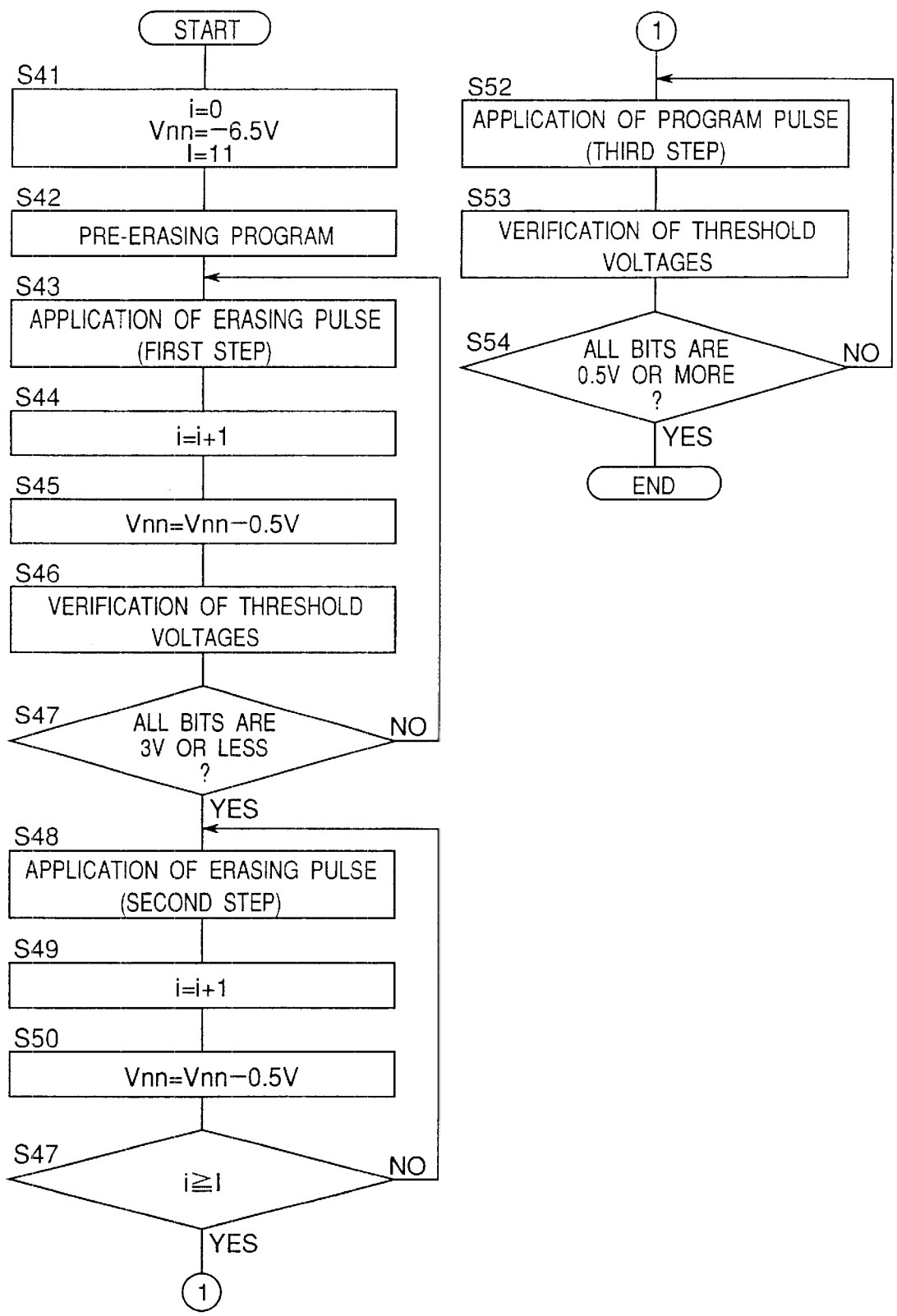
FIG. 8 is a flow chart showing an erasing operation different from those of FIGS. 2 and 5.
Figure 9:
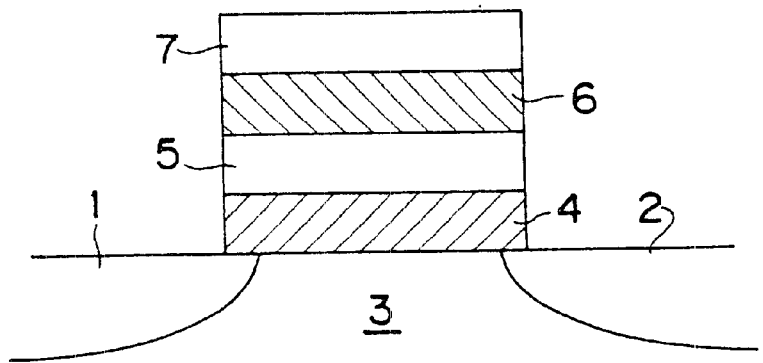
FIG. 9 is a schematic cross sectional view showing an ETOX-type flash memory cell.
Figure 10:
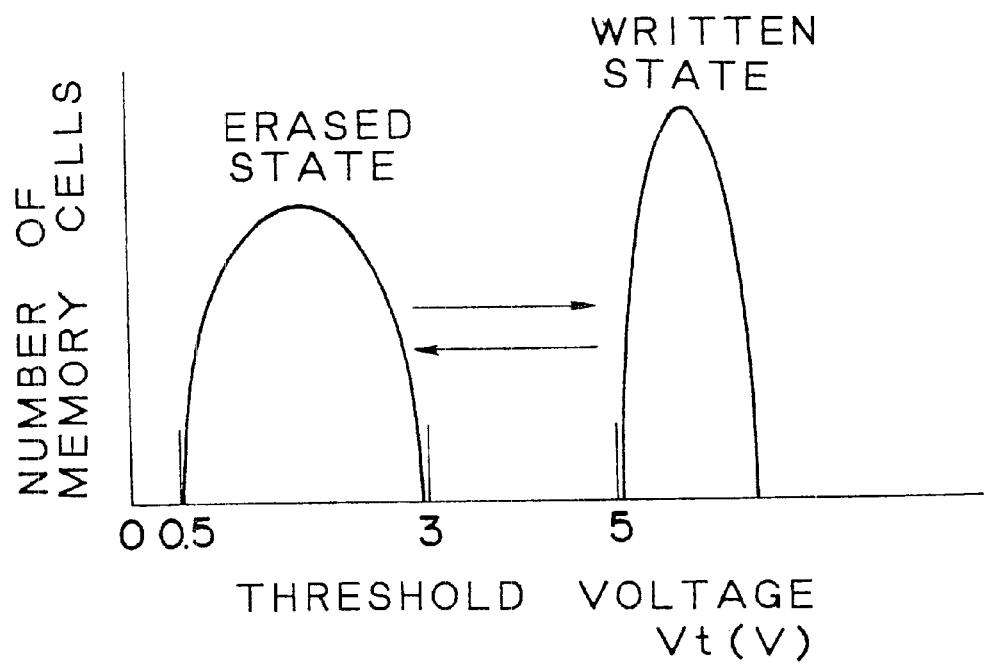
FIG. 10 is a view showing a change in a threshold voltage distribution in a normal written state and in an erased state of the memory cell of FIG. 9.
Figure 11:
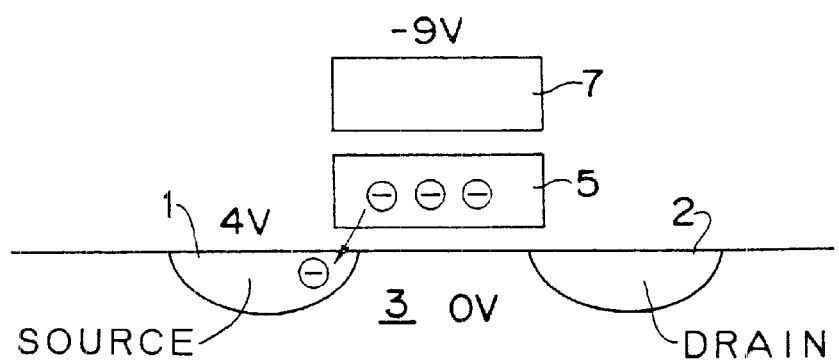
FIG. 11 is a schematic view showing an operation in conventional source-side erasing.

FIG. 8 shows an algorism of an erasing operation in the present embodiment. Hereinbelow, the erasing operation in this embodiment will be described in detail with reference to FIG. 8. In a step S41, the count value i of the pulse counter 11 is initialized to "0", the voltage Vnn of the control gate applied pulse is initialized to "−6.5V", and the pulse width W of the control gate applied pulse is initialized to "10 ms". A maximum value I of the count value i is set to "11". The value "11" of the maximum value I is obtained from the number of application necessary for the most erase-slow memory cell to have the threshold voltage of 1.5V shown in FIG. 7.

In a step S42, a pre-erasing program is executed for all the memory cells within an erasing-target block. As a result, threshold voltages of all the memory cells are set to 5V or more. In a step S43, an erasing pulse is applied to all the memory cells within the erasing-target block (the first step). In a step S44, the count value i of the pulse counter 11 is incremented. In a step S45, the voltage Vnn is decreased by 0.5V, while voltages of erasing pulses other than the control gate applied pulse have no change. In a step S46, verification of the threshold voltage is performed. In a step S47, it is determined as a result of the threshold voltage verification if the threshold voltages of all the memory cells are 3V or less. If it is determined that the threshold voltages of all the memory cells are 3V or less, the procedure proceeds to a step S48. If not, the procedure returns to the step S43, and application of the erasing pulse is repeated. Thus, application of the erasing pulse and verification are performed alternately till the threshold voltages of all the memory cells are determined to be 3V or less to set the threshold voltages of all the memory cell in the block to 3V or less.

It is noted that the voltage Vnn applied to the control gate is decreased in sequence by 0.5V as shown in FIG. 6. In addition, the voltage Vesc (ex., +7V) is applied to the source and the first well (channel region) In that operation, as shown in FIG. 7, the threshold voltages of all the cells become 3V or less when the pulse is applied to the control gate 8 times. The pulse voltage Vnn in that case is −10V as shown in FIG. 6. As the pulse width is 10 ms here, the total pulse application time in the first step is 80 ms.

Thus, the procedure shifts to the second step. In a step S48, an erasing pulse is applied (second step). In a step S49, the count value i of the pulse counter 11 is incremented. In a step S50, the voltage Vnn is lowered by 0.5V. In a step S51, it is determined if the count value i is equal to or more than the maximum value I. If it is determined as a result that the count value is equal to or more than the maximum value I, the procedure proceeds to a step S52. If not, the procedure returns to the step S48 and application of the erasing pulse is repeated. Like the first and the second embodiments, a verifying operation is not conducted in the present invention.

As stated above, the first step is terminated when the voltage Vnn of the control gate applied pulse equals to −10V. Therefore, pulse application to the control gate in the second step starts with the voltage Vnn=−10.5V (9th application), and after 3 times of pulse application is conducted, the count value i reaches the maximum value I (=11). Herein, a voltage applied to the source and the first well (channel region) is Vesc (ex., +7V), and the threshold voltages of all the memory cells within an erasing-target block are 1.5V or less as shown in FIG. 7. Since the pulse width of the control gate applied pulse is remained to be 10 ms, the total pulse application time in the second step is 30 ms (=10 ms×3).

As a result of the above, the total pulse application time of the first and the second steps amounts to 110 ms, which is 50 ms (30%) shorter than 160 ms of the first and the second embodiments.

Although omitted in FIG. 8 for simplifying description, there are required, in the first step routine and the second step routine, determination if the voltage Vnn of the control gate applied pulse reaches the lower limit value (ex., −12V), as well as increase of a pulse width upon reaching of the lower limit value. When an erasing speed of the memory cells is extremely slow due to manufacturing dispersion or changes of characteristics, and the voltage Vnn of the control gate applied pulse reaches the lower limit value (ex., −12V) in the middle of the first step or the second step, the voltage Vnn of the applied pulse is not changed thereafter, and the pulse width thereof is increased like 20 ms, 40 ms, 80 ms . . . shown in FIG. 6.

Thus, the routine shifts to a third step. In steps S52 through S54, application of a program pulse (channel writing), verification of threshold voltages, and determination of the result of the threshold voltage verification are executed in the same way as the steps S28 through S30 in the first embodiment shown in FIG. 2. If all the memory cells in an erasing-target block are 0.5V or more, the erasing operation of the block is terminated.

As a result, a distribution of the threshold voltages of all the memory cells in the same block falls within the range of 0.5V to 2V. Thus, a tight threshold voltage distribution is obtained while the threshold voltages are set to 2V or less, enabling implementation of a normal erasing operation.

According to the present embodiment, as stated above, the channel erasing is conducted with two steps consisting of the first step and the second step like the first and the second embodiments, which enables normal erasing which makes a distribution of the threshold voltages tight and within 2V or less.

Further, in the present embodiment, through the above-stated first and the second steps, the applied voltage Vnn to the control gate is lowered from the initial value of −6.5V by 0.5V with every application of the pulse. In lowering the applied voltage, a lower limit value of the voltage Vnn is specified to prevent negative influences on a resisting voltage of an insulating film and the like. In addition, the total application number I of the control gate applied pulse necessary for the most erase-slow memory cell to have a threshold voltage of 1.5V with the voltage increment erasing method is predetermined from erasing characteristics of the memory cells.

In the above first step, there are conducted application of the erasing pulses including the control gate applied pulse with the voltage increment erasing method, and verification, so that the threshold voltages of all the memory cells in a block is set to 3V or less. Further, in application of the erasing pulse in the second step, pulse application to the control gate executed with the voltage increment erasing method in the first step is repeated for I times.

Consequently, the first step for implementing both setting the threshold voltages of all the memory cells to the erasing level of 3V or less and preventing generation of a memory cell with a negative threshold voltage in the same block, and the second step for ensuring that threshold voltages of all the memory cells are set to 1.5V or less without a verifying operation can be performed with the erasing pulse application time shorter than that in the case of the first and the second embodiments.

In the above description, although description has been given of the case where pulse application to the control gate with the voltage increment erasing method is continuously performed at the time of shifting from the first step to the second step, the present invention is not limited thereto. Corresponding to erasing characteristics of the memory cells, a modification width of the applied voltages as well as starting voltages may be changed between the first step and the second step. Further, a pulse width is also changeable between the first step and the second step.

Further, the voltage increment erasing method is applicable to either the first step or the second step. The voltage increment erasing method is also applicable to the pulse applied to the source or the first well.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An erasing method for a nonvolatile semiconductor memory device comprising: floating-gate field-effect transistors, which have a control gate, a floating gate, a drain, and a source, and enable electric writing and erasing of information, disposed in a matrix configuration on a substrate or on a well; a plurality of row lines connected to the control gate of each floating-gate field-effect transistor arrayed in a row direction; and a plurality of column lines connected to the drain of each floating-gate field-effect transistor arrayed in a column direction, the source of each floating-gate field-effect transistor constituting a block being connected in common, wherein the erasing operation is conducted in the block units with use of a Fowler-Nordheim tunneling phenomenon; and comprises a first step for lowering threshold voltages of all the floating-gate field-effect transistors within the block to a voltage higher than 0, and equal to or lower than a first specified voltage in an erased state; a second step for lowering the threshold voltages to a voltage equal to or lower than a second specified voltage that is lower than the first specified voltage; and a third step for raising the threshold voltages to a voltage higher than 0.

2. The erasing method for the nonvolatile semiconductor memory device as defined in claim 1, wherein the first step includes an applying operation of a first erasing pulse for lowering the threshold voltages, and a verifying operation for verifying lowered threshold voltages.

3. The erasing method for the nonvolatile semiconductor memory device as defined in claim 2, wherein a reference voltage used in the verifying operation is higher than an upper limit voltage in a distribution of the threshold voltages finally obtained by the erasing operation.

4. The erasing method for the nonvolatile semiconductor memory device as defined in claim 2, wherein the second step includes an applying operation of a second erasing pulse for lowering the threshold voltages, and excludes a verifying operation for verifying lowered threshold voltages.

5. The erasing method for the nonvolatile semiconductor memory device as defined in claim 4, wherein number of application of the second erasing pulse is N (positive integer number) times as large as number of application of the first erasing pulse, and the threshold voltages upon termination of the second step are lower than an upper limit voltage in a distribution of the threshold voltages finally obtained by the erasing operation.

6. The erasing method for the nonvolatile semiconductor memory device as defined in claim 5, wherein assumed that number of application of the first erasing pulse is i, total application time of the second erasing pulse is (i×N) times as large as a pulse width of the first erasing pulse.

7. The erasing method for the nonvolatile semiconductor memory device as defined in claim 6, wherein the total application time of the second erasing pulse in the second step is divided by a pulse width of one or a plurality of the second pulses.

8. The erasing method for the nonvolatile semiconductor memory device as defined in claim 7, wherein the pulse width of the second erasing pulse by which the total application time of the pulse in the second step is divided is N times as large as a pulse width of the first erasing pulse, and pulse number of the second erasing pulse is i.

9. The erasing method for the nonvolatile semiconductor memory device as defined in claim 1, wherein the third step includes an applying operation of a writing pulse for raising the threshold voltages, and a verifying operation for verifying raised threshold voltages.

10. The erasing method for the nonvolatile semiconductor memory device as defined in claim 9, wherein a reference voltage used in the verifying operation is a lower limit voltage in a distribution of the threshold voltages finally obtained by the erasing operation.

11. The erasing method for the nonvolatile semiconductor memory device as defined in claim 2, wherein an absolute value of a pulse voltage of at least either the first erasing pulse or the second erasing pulse is raised by an absolute value of a specified voltage whenever application is executed.

12. The erasing method for the nonvolatile semiconductor memory device as defined in claim 11, wherein absolute values of pulse voltages of the first erasing pulse and the second erasing pulse are raised whenever application is executed, an absolute value of a pulse voltage of the second erasing pulse applied first in the second step is a value obtained by adding an absolute value of the specified voltage to an absolute value of a pulse voltage of the first erasing pulse applied last in the first step.

13. The erasing method for the nonvolatile semiconductor memory device as defined in claim 1, wherein lowering of the threshold voltages in the first step and the second step is implemented by pulling electrons from the floating gate of all the floating-gate field-effect transistors within the block toward a channel side.

14. The erasing method for the nonvolatile semiconductor memory device as defined in claim 1, wherein raising of the threshold voltages in the third step is implemented by injecting electrons from a channel side to the floating gate of all the floating-gate field-effect transistors within the block.

* * * * *